(12) United States Patent
Chen (10) Patent No.: US 10,102,806 B2
(45) Date of Patent: Oct. 16, 2018

(54) SHIFT REGISTER, GATE DRIVING CIRCUIT, ARRAY SUBSTRATE

(71) Applicants: BOE TECHNOLOGY GROUP CO., LTD., Beijing (CN); BEIJING BOE DISPLAY TECHNOLOGY CO., LTD., Beijing (CN)

(72) Inventor: Huabin Chen, Beijing (CN)

(73) Assignees: BOE TECHNOLOGY GROUP CO., LTD., Beijing (CN); BEIJING BOE DISPLAY TECHNOLOGY CO., LTD., Beijing (CN)

( * ) Notice: Subject to any disclaimer, the term of this patent is extended or adjusted under 35 U.S.C. 154(b) by 0 days.

(21) Appl. No.: 15/543,437

(22) PCT Filed: Jan. 5, 2017

(86) PCT No.: PCT/CN2017/070233
§ 371 (c)(1),
(2) Date: Jul. 13, 2017

(87) PCT Pub. No.: WO2017/185822
PCT Pub. Date: Nov. 2, 2017

(65) Prior Publication Data
US 2018/0218688 A1 Aug. 2, 2018

(30) Foreign Application Priority Data
Apr. 26, 2016 (CN) .................... 2016 2 0359115 U (51) Int. Cl.
*G11C 19/00* (2006.01)
*G09G 3/3266* (2016.01)
(Continued)

(52) U.S. Cl.
CPC .......... *G09G 3/3266* (2013.01); *G09G 3/344* (2013.01); *G09G 3/3677* (2013.01); *G11C 19/28* (2013.01);
(Continued)

(58) Field of Classification Search
None
See application file for complete search history.

(56) References Cited

U.S. PATENT DOCUMENTS 8,953,737 B2 * 2/2015 Jang ...................... G09G 3/3688
377/64
9,257,198 B2 2/2016 Yan
(Continued)

FOREIGN PATENT DOCUMENTS

CN 101533623 A 9/2009
CN 102629444 A 8/2012
(Continued)

OTHER PUBLICATIONS

International Search report dated Mar. 29, 2017 in corresponding International Application No. PCT/CN2017/070233 along with an English translation of the International Search Report and an English translation of the Written Opinion of the International Searching Authority.

*Primary Examiner* — Tuan T Lam
(74) *Attorney, Agent, or Firm* — Nath Goldberg & Meyer; Joshua B. Goldberg (57) ABSTRACT

A shift register, comprising: a buffer discharging device which controls whether to transfer a signal of a fixed voltage terminal to an output terminal and whether to transfer the signal of the fixed voltage terminal and a signal of a second clock signal terminal to a pull-up node in accordance with a signal of an input terminal, a signal of a reset terminal and a level of a pull-down node; a holding device which controls the level of the pull-down node in accordance with the signal
(Continued)

of the second clock signal terminal and a level of the pull-up node; an output device which controls whether to transfer a signal of a first clock signal terminal to the output terminal; a pull-down device which controls whether to transfer the signal of the fixed voltage terminal to the output terminal; a charging device which retains a level of the output terminal.

20 Claims, 4 Drawing Sheets

(51) Int. Cl.
*G09G 3/34* (2006.01)
*G09G 3/36* (2006.01)
*G11C 19/28* (2006.01)

(52) U.S. Cl.
CPC .............. *G09G 2310/0283* (2013.01); *G09G 2310/0286* (2013.01); *G09G 2310/061* (2013.01)

(56) References Cited

U.S. PATENT DOCUMENTS

| | | | |
|---|---|---|---|
| 9,791,968 B2* | 10/2017 | Hu | ............... G06F 3/0416 |
| 2013/0088265 A1 | 4/2013 | Chen | |
| 2015/0332784 A1* | 11/2015 | Yan | ............... G09G 3/3611 |
| | | | 377/64 |
| 2016/0071614 A1* | 3/2016 | Lee | ............... G09G 5/006 |
| | | | 345/214 |
| 2016/0372070 A1* | 12/2016 | Hu | ............... G09G 3/3614 |

FOREIGN PATENT DOCUMENTS

| | | |
|---|---|---|
| CN | 104064153 A | 9/2014 |
| CN | 205564251 U | 9/2016 |
| JP | 2009-181612 A | 8/2009 |
| JP | 2011-2721 A | 1/2011 |

* cited by examiner

SHIFT REGISTER, GATE DRIVING CIRCUIT, ARRAY SUBSTRATE

This is a National Phase Application filed under 35 U.S.C. 371 as a national stage of PCT/CN2017/070233, filed Jan. 5, 2017, an application claiming the benefit of Chinese Application No. 201620359115.4, filed Apr. 26, 2016, the content of each of which is hereby incorporated by reference in its entirety.

FIELD

The present invention relates to a field of gate driving technology, and particularly, to a shift register, a gate driving circuit and an array substrate.

BACKGROUND

In an array substrate of a GOA (Gate On Array) mode, a gate driving circuit for driving gate lines to generate scanning signals (i.e., output turn-on signals in turns) is directly provided on a substrate base of the array substrate, the gate driving circuit comprises a plurality of cascaded shift registers, an output terminal of each of the shift registers is connected to one of the gate lines, by providing several simple control signals to the gate driving circuit, the shift registers sequentially output turn-on signals to the gate lines.

Generally, there is a fixed scanning direction for the gate lines in the array substrate, for example, a forward (from top to bottom) scanning direction or a backward (from bottom to top) scanning direction. However, in some cases (e.g., when a multi-screen display is performed), it may require to achieve a dual scanning function, that is, require the array substrate to either scan forward or scan backward.

In order to achieve the dual scanning function, the gate driving circuit must be changed to increase the number of devices therein and simultaneously increase the number of control signals (i.e., increase the number of control signal lines) required by the gate driving circuit, resulting in a complex structure of the gate driving circuit of prior art for achieving the dual scanning function and a large number of control signals required by the gate driving circuit.

SUMMARY

Embodiments of the present invention provides a shift register with a simple structure and a small number of control signals required, a gate driving circuit comprising the shift register, and an array substrate comprising the gate driving circuit.

An embodiment of the present invention is a shift register comprising a buffer discharging device, a holding device, an output device, a pull-down device, a charging device, an input terminal, a reset terminal, a first clock signal terminal, a second clock signal terminal, a fixed voltage terminal and an output terminal, wherein:

the buffer discharging device is configured to control whether to transfer a signal of the fixed voltage terminal to the output terminal and whether to transfer the signal of the fixed voltage terminal and a signal of the second clock signal terminal to a pull-up node in accordance with a signal of the input terminal, a signal of the reset terminal and a level of a pull-down node;

the holding device is configured to control the level of the pull-down node in accordance with the signal of the second clock signal terminal and a level of the pull-up node;

the output device is configured to control whether to transfer a signal of the first clock signal terminal to the output terminal in accordance with the level of the pull-up node;

the pull-down device is configured to control whether to transfer the signal of the fixed voltage terminal to the output terminal in accordance with the signal of the second clock signal terminal;

the charging device is configured to retain a level of the output terminal.

Optionally, the buffer discharging device comprises a first transistor, a second transistor, a third transistor and a fourth transistor, wherein:

a first electrode of the first transistor is connected to the second clock signal terminal, a second electrode of the first transistor is connected to the pull-up node, and a gate of the first transistor is connected to the input terminal;

a first electrode of the second transistor is connected to the pull-up node, a second electrode of the second transistor is connected to the first clock signal terminal, and a gate of the second transistor is connected to the reset terminal;

a first electrode of the third transistor is connected to the pull-up node, a second electrode of the third transistor is connected to the fixed voltage terminal, and a gate of the third transistor is connected to the pull-down node;

a first electrode of the fourth transistor is connected to the output terminal, a second electrode of the fourth transistor is connected to the fixed voltage terminal, and a gate of the fourth transistor is connected to the pull-down node.

Further optionally, the holding device comprises a fifth transistor, a sixth transistor, a seventh transistor, an eighth transistor, wherein:

a first electrode of the fifth transistor is connected to the second clock signal terminal, a second electrode of the fifth transistor is connected to the pull-down node, and a gate of the fifth transistor is connected to a first electrode of the seventh transistor and a second electrode of the eighth transistor;

a first electrode of the sixth transistor is connected to the pull-down node, a second electrode of the sixth transistor is connected to the fixed voltage terminal, and a gate of the sixth transistor is connected to the pull-up node;

the first electrode of the seventh transistor is connected to the gate of the fifth transistor, a second electrode of the seventh transistor is connected to the fixed voltage terminal, and a gate of the seventh transistor is connected to the pull-up node;

a first electrode of the eighth transistor is connected to the second clock signal terminal, the second electrode of the eighth transistor is connected to the gate of the fifth transistor, and a gate of the eighth transistor is connected to the second clock signal terminal.

Further optionally, the output device comprises a ninth transistor, wherein:

a first electrode of the ninth transistor is connected to the first clock signal terminal, a second electrode of the ninth transistor is connected to the output terminal, and a gate of the ninth transistor is connected to the pull-up node.

Further optionally, the pull-down device comprises a tenth transistor, wherein:

a first electrode of the tenth transistor is connected to the output terminal, a second electrode of the tenth transistor is connected to the fixed voltage terminal, and a gate of the tenth transistor is connected to the second clock signal terminal.

Further optionally, the charging device comprises a storage capacitor, wherein:

a first terminal of the storage capacitor is connected to the pull-up node, a second terminal of the storage capacitor is connected to the output terminal.

Further optionally, all the transistors are N type transistors; or all the transistors are P type transistors.

Another embodiment of the present invention is a gate driving circuit, comprising:

a plurality of cascaded shift transistors, each of the shift transistors is the shift transistor described above.

Optionally, the gate driving circuit further comprises a first control line, a second control line, a fixed voltage line, wherein:

the first control line is connected to the first clock signal terminals of all the shift registers at odd stages and the second clock signal terminals of all the shift registers at even stages;

the second control line is connected to the first clock signal terminals of all the shift registers at even stages and the second clock signal terminals of all the shift registers at odd stages;

the fixed voltage line is connected to the fixed voltage terminal of each of the shift registers;

the pull-up node of each of the shift registers is connected to the reset terminal of the shift register at a previous stage and the input terminal of the shift register at a next stage.

Optionally, a separate signal is input into the input terminal of the shift register at a first stage, and another separate signal is input into the reset terminal of the shift register at a last stage.

Further another embodiment of the present invention is an array substrate, comprising:

a plurality of gate lines;

the gate driving circuit described above, the output terminal of each of the shift registers of the gate driving circuit is connected to one of the gate lines.

The gate driving circuit of the embodiment of the present invention can achieve the dual scanning function, the number of devices therein is small and is equivalent to the number of devices in the gate driving circuit of prior art for achieving a single-direction scanning function, and moreover, the gate driving circuit of the embodiment of the present invention only requires two control signals (i.e., two clock signals), which is the same as the gate driving circuit of prior art for achieving the single-direction scanning function, resulting in a simple structure and a low cost of the gate driving circuit of the embodiment of the present invention.

DETAILED DESCRIPTION OF THE EMBODIMENTS

In order to make a person skilled in the art understand technical solutions of the present invention better, the present invention will be described in detail below in conjunction with accompanying drawings and embodiments.

First Embodiment

Figure 1:
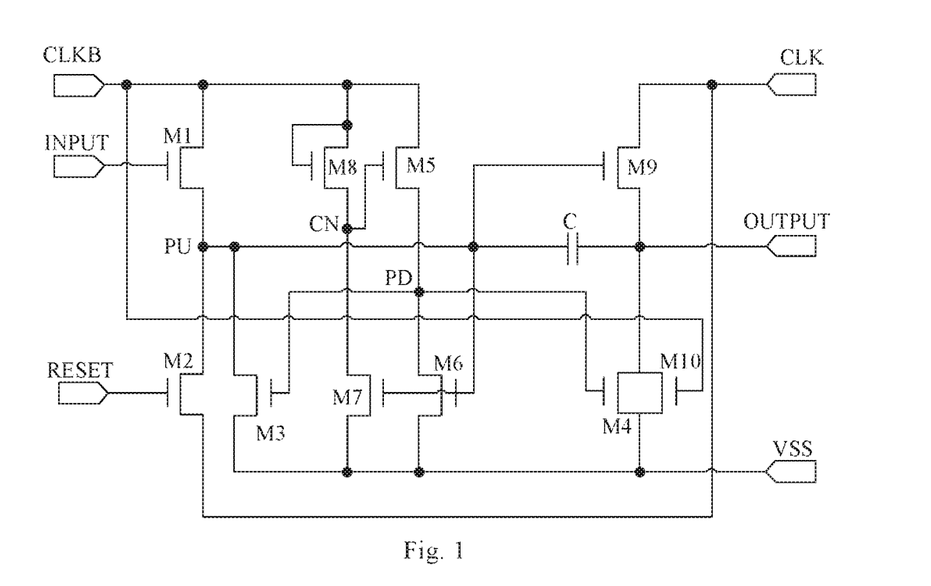
FIG. 1 shows a structural diagram of a shift register in an embodiment of the present invention.

As shown in FIGS. 1-4, the present embodiment provides a shift register comprising a buffer discharging device, a holding device, an output device, a pull-down device, a charging device, an input terminal, a reset terminal, a first clock signal terminal, a second clock signal terminal, a fixed voltage terminal and an output terminal, wherein:

the buffer discharging device is configured to control whether to transfer a signal of the fixed voltage terminal VSS to the output terminal OUTPUT and whether to transfer the signal of the fixed voltage terminal VSS and a signal of the second clock signal terminal CLKB to a pull-up node PU in accordance with a signal of the input terminal INPUT, a signal of the reset terminal RESET and a level of a pull-down node PD;

the holding device is configured to control the level of the pull-down node PD in accordance with the signal of the second clock signal terminal CLKB and a level of the pull-up node PU;

the output device is configured to control whether to transfer a signal of the first clock signal terminal CLK to the output terminal OUTPUT in accordance with the level of the pull-up node PU;

the pull-down device is configured to control whether to transfer the signal of the fixed voltage terminal VSS to the output terminal OUTPUT in accordance with the signal of the second clock signal terminal CLKB;

the charging device is configured to retain a level of the output terminal OUTPUT.

As shown in FIG. 1, optionally, the buffer discharging device comprises a first transistor M1, a second transistor M2, a third transistor M3 and a fourth transistor M4, wherein:

a first electrode of the first transistor M1 is connected to the second clock signal terminal CLKB, a second electrode of the first transistor M1 is connected to the pull-up node PU, and a gate of the first transistor M1 is connected to the input terminal INPUT;

a first electrode of the second transistor M2 is connected to the pull-up node PU, a second electrode of the second transistor M2 is connected to the first clock signal terminal CLK, and a gate of the second transistor M2 is connected to the reset terminal RESET;

a first electrode of the third transistor M3 is connected to the pull-up node PU, a second electrode of the third transistor M3 is connected to the fixed voltage terminal VSS, and a gate of the third transistor M3 is connected to the pull-down node PD;

a first electrode of the fourth transistor M4 is connected to the output terminal OUTPUT, a second electrode of the fourth transistor M4 is connected to the fixed voltage terminal VSS, and a gate of the fourth transistor M4 is connected to the pull-down node PD.

Further optionally, the holding device comprises a fifth transistor M5, a sixth transistor M6, a seventh transistor M7, an eighth transistor M8, wherein:

a first electrode of the fifth transistor M5 is connected to the second clock signal terminal CLKB, a second electrode of the fifth transistor M5 is connected to the pull-down node PD, and a gate of the fifth transistor M5 is connected to a first electrode of the seventh transistor M7 and a second electrode of the eighth transistor M8;

a first electrode of the sixth transistor M6 is connected to the pull-down node PD, a second electrode of the sixth transistor M6 is connected to the fixed voltage terminal VSS, and a gate of the sixth transistor M6 is connected to the pull-up node PU;

the first electrode of the seventh transistor M7 is connected to the gate of the fifth transistor M5, a second electrode of the seventh transistor M7 is connected to the fixed voltage terminal VSS, and a gate of the seventh transistor M7 is connected to the pull-up node PU;

a first electrode of the eighth transistor M8 is connected to the second clock signal terminal CLKB, the second electrode of the eighth transistor M8 is connected to the gate of the fifth transistor M5, and a gate of the eighth transistor M8 is connected to the second clock signal terminal CLKB.

Further optionally, the output device comprises a ninth transistor M9, wherein:

a first electrode of the ninth transistor M9 is connected to the first clock signal terminal CLK, a second electrode of the ninth transistor M9 is connected to the output terminal OUTPUT, and a gate of the ninth transistor M9 is connected to the pull-up node PU.

Further optionally, the pull-down device comprises a tenth transistor M10, wherein:

a first electrode of the tenth transistor M10 is connected to the output terminal OUTPUT, a second electrode of the tenth transistor M10 is connected to the fixed voltage terminal VSS, and a gate of the tenth transistor M10 is connected to the second clock signal terminal CLKB.

Further optionally, the charging device comprises a storage capacitor C, wherein:

a first terminal of the storage capacitor C is connected to the pull-up node PU, a second terminal of the storage capacitor C is connected to the output terminal OUTPUT.

Further optionally, all the transistors are N type transistors, particularly N type thin film transistors; or all the transistors are P type transistors, particularly P type thin film transistors.

The present embodiment further provides a gate driving circuit, comprising:

a plurality of cascaded shift transistors, each of the shift transistors is the shift transistor described above.

Figure 2:
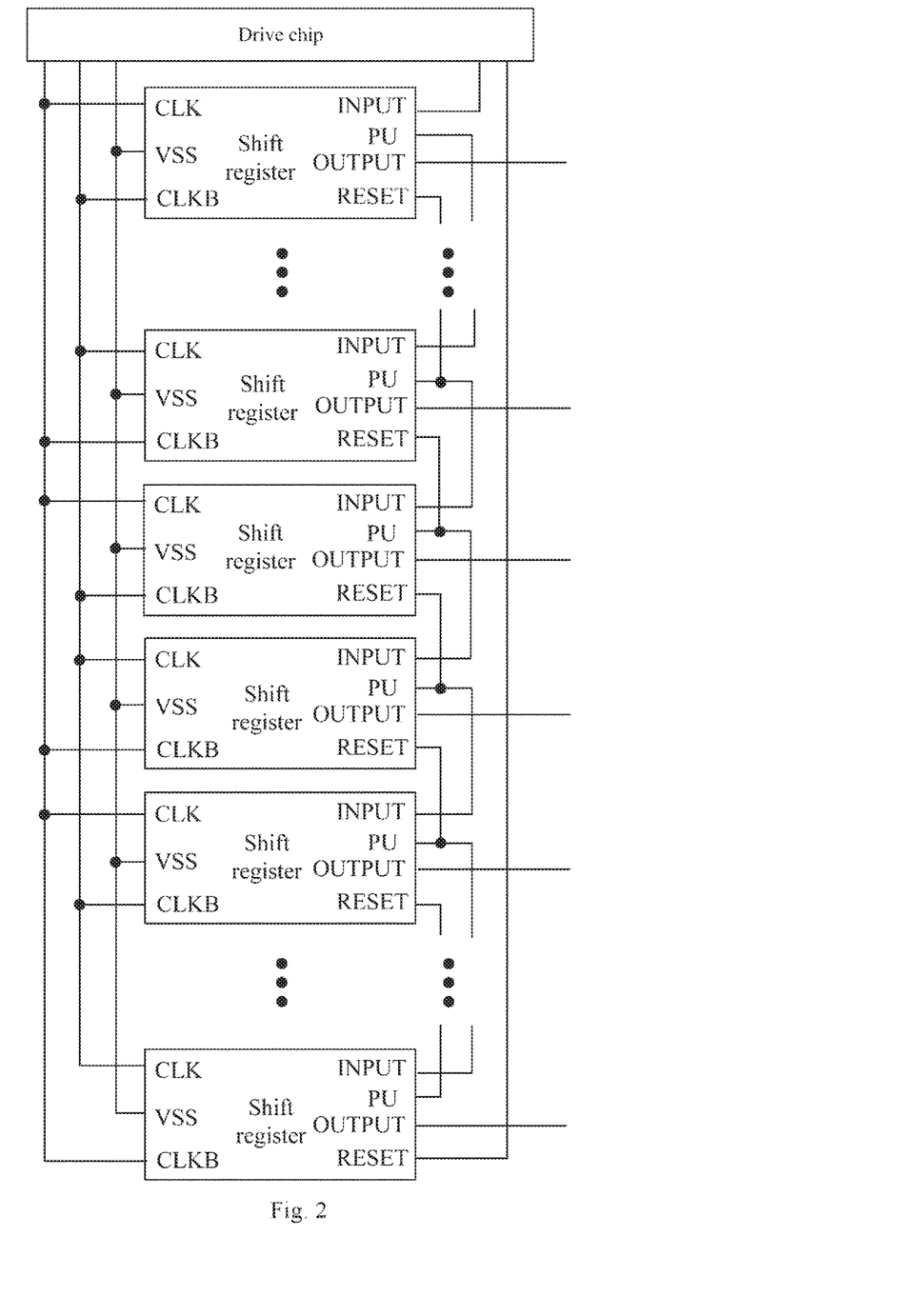
FIG. 2 shows a configuration block diagram of a gate driving circuit in an embodiment of the present invention.

Optionally, as shown in FIG. 2, the gate driving circuit further comprises a first control line, a second control line, a fixed voltage line, wherein:

the first control line is connected to the first clock signal terminals CLK of all the shift registers at odd stages and the second clock signal terminals CLKB of all the shift registers at even stages;

the second control line is connected to the first clock signal terminals CLK of all the shift registers at even stages and the second clock signal terminals CLKB of all the shift registers at odd stages;

the fixed voltage line is connected to the fixed voltage terminal VSS of each of the shift registers;

the pull-up node PU of each of the shift registers is connected to the reset terminal RESET of the shift register at a previous stage and the input terminal of the shift register at a next stage.

That is to say, in the gate driving circuit of the present embodiment, each of the shift registers is connected to others of the shift registers by the pull-up node thereof rather than the output terminal thereof, and certainly, in such connection mode, there is no signal input into the input terminal INPUT of the shift register at the first stage and the reset terminal RESET of the shift register at the last stage, thus special signal lines are required to be provided for them for introducing initial signals to cause the gate driving circuit to start operating, which will not be described in detail herein.

Simultaneously, two control lines (i.e., the first control line and the second control line) of the gate driving circuit are provided with clock signals having opposite phases, and connection ways of adjacent shift registers with the two control lines are opposite, so as to ensure that the adjacent shift registers actually receive a same clock signal; the fixed voltage line provides a constant level signal to the fixed voltage terminal VSS of each of the shift registers.

The gate driving circuit of the present embodiment can achieve the dual scanning function, the number of devices therein is small and is equivalent to the number of devices in the gate driving circuit of prior art for achieving a single-direction scanning function, and moreover, the gate driving circuit of the present embodiment only requires two control signals (i.e., two clock signals, the constant level signal may be referred to as a non-control signal), which is the same as the gate driving circuit of prior art for achieving the single-direction scanning function, resulting in a simple structure and a low cost of the gate driving circuit of the present embodiment.

Specifically, an operation mode of the gate driving circuit of the present embodiment will be described below by taking all the transistors being N type transistors as an example.

Figure 3:
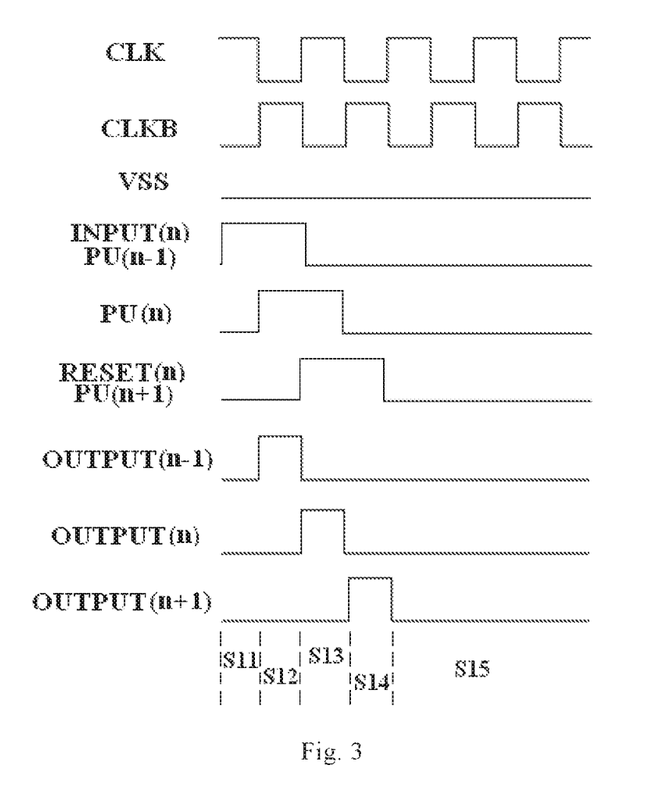
FIG. 3 shows a timing diagram of signals of the shift registers when the gate driving circuit in an embodiment of the present invention performs a forward scanning.

Situation S1: when the gate driving circuit of the present embodiment performs a forward (from top to bottom) scanning, as shown in FIG. 3, a procedure of operations of the shift registers in the gate driving circuit specifically comprises following periods of S11 to S15.

During a period of S11, a high level signal is provided to the first clock signal terminal CLK, a low level signal is provided to the second clock signal terminal CLKB, another high level signal is provided to the input terminal INPUT, another low level signal is provided to the reset terminal RESET, and further another low level signal is provided to the fixed voltage terminal VSS.

It should be noted that, during this period, there is no change for an actual operation status of the shift register at a current stage ($n^{th}$ stage), but since the input terminal INPUT thereof is connected to the pull-up node PU of the shift register at the previous stage (($n-1)^{th}$ stage), the status thereof during this period is real. Certainly, for the shift register at the first stage, a separate signal may be input into the input terminal INPUT thereof, thus there is no this period therefor, the following period of S12 is directly started.

During the forward scanning, the shift register at the previous stage (($n-1)^{th}$ stage) operates prior to the shift register at the current stage ($n^{th}$ stage), thus a high level signal will be provided to the input terminal INPUT of the shift register at the current stage when the pull-up node PU of the shift register at the previous stage becomes to be at a high level. Thus, in the shift register at the current stage, the first transistor M1 is turned on, the low level signal of the second clock signal terminal CLKB is introduced to the pull-up node PU through the first transistor M1, and the pull-up node PU is at a low level, due to a function of the storage capacitor C, the output terminal OUTPUT is also at a low level, and the shift register at the current stage outputs a low level signal.

During a period of S12, a low level signal is provided to the first clock signal terminal CLK, a high level signal is provided to the second clock signal terminal CLKB, another high level signal is provided to the input terminal INPUT, another low level signal is provided to the reset terminal RESET, and further another low level signal is provided to the fixed voltage terminal VSS.

During this period, the input terminal INPUT of the shift register at the current stage is still at the high level, the first transistor M1 is still turned on so that the high level signal of the second clock signal terminal CLKB is introduced to the pull-up node PU, the pull-up node PU becomes to be at a high level, that is, both the reset terminal RESET of the shift register at the previous stage ((n−1)$^{th}$ stage) and the input terminal INPUT of the shift register at the next stage ((n+1)$^{th}$ stage) become to be at a high level, the shift register at the previous stage enters the following period of S13, and the shift register at the next stage enters the period of S11 described above. Since the pull-up node PU is at the high level, the ninth transistor M9 is turned on so that the low level of the first clock signal terminal CLK is introduced to the output terminal OUTPUT, and the shift register at the current stage still outputs the low level signal. Simultaneously, in the shift register at the current stage, the high level of the pull-up node PU makes the sixth transistor M6 and the seventh transistor M7 be turned on so that the low level of the fixed voltage terminal VSS is introduced to a control node CN and the pull-down node PD, although the second clock signal terminal CLKB is at the high level at this time, since the eighth transistor M8 is equivalent to be open, the fifth transistor M5 is also turned off.

During a period of S13, a high level signal is provided to the first clock signal terminal CLK, a low level signal is provided to the second clock signal terminal CLKB, another low level signal is provided to the input terminal INPUT, another high level signal is provided to the reset terminal RESET, and further another low level signal is provided to the fixed voltage terminal VSS.

During this period, both the input terminal INPUT and the second clock signal terminal CLKB of the shift register at the current stage become to be at a low level, thus the first transistor M1 and the tenth transistor M10 are turned off, the signals of the second clock signal terminal CLKB and the fixed voltage terminal VSS cannot enter the pull-up node PU and the output terminal OUTPUT, but the signal of the reset terminal RESET is the signal of the pull-up node PU of the shift register at the next stage ((n+1)$^{th}$ stage) and becomes a high level, thus the second transistor M2 is turned on, the high level of the first clock signal terminal CLK enters the pull-up node PU through the second transistor M2, the pull-up node PU retains the high level, thereby the ninth transistor M9 is turned on, the high level of the first clock signal terminal CLK is introduced to the output terminal OUTPUT through the ninth transistor M9, and the shift register at the current stage outputs a high level.

During a period of S14, a low level signal is provided to the first clock signal terminal CLK, a high level signal is provided to the second clock signal terminal CLKB, another low level signal is provided to the input terminal INPUT, another high level signal is provided to the reset terminal RESET, and further another low level signal is provided to the fixed voltage terminal VSS.

During this period, the reset terminal RESET of the shift register at the current stage is still at the high level so that the low level of the first clock signal terminal CLK is transferred to the pull-up node PU through the second transistor M2, the pull-up node PU becomes to be at a low level, that is, both the reset terminal RESET of the shift register at the previous stage ((n−1)$^{th}$ stage) and the input terminal INPUT of the shift register at the next stage ((n+1)$^{th}$ stage) become to be at a low level, the shift register at the previous stage enters the following period of S15, and the shift register at the next stage enters the period of S13 described above. Further, the sixth transistor M6 and the seventh transistor M7 are turned off, the low level of the fixed voltage terminal VSS cannot enter the control node CN and the pull-down node PD, the high level signal of the second clock signal terminal CLKB enters the control node CN and the pull-down node PD respectively through the eighth transistor M8 and the fifth transistor M5 so that both the control node CN and the pull-down node PD are at the high level. Thus, both the third transistor M3 and the fourth transistor M4 connected to the pull-down node PD are turned on, the low level signal of the fixed voltage terminal VSS is introduced to the output terminal OUTPUT through the fourth transistor M4 (certainly, also through the tenth transistor M10), the shift register at the current stage outputs a low level signal.

During a period of S15, a low level signal is provided to the input terminal INPUT, another low level signal is provided to the reset terminal RESET, and further another low level signal is provided to the fixed voltage terminal VSS.

During this period, both the input terminal INPUT and the reset terminal RESET of the shift register at the current stage are at the low level, thus both the first transistor M1 and the second transistor M2 are turned off.

In this way, in the shift register at the current stage, when the second clock signal terminal CLKB provides a high level signal, all the eighth transistor M8, the fifth transistor M5, the tenth transistor M10 are turned on, the pull-down node PD is at a high level, thus the third transistor M3 and the fourth transistor M4 are turned on, the low level of the fixed voltage terminal VSS makes both the pull-up node PU and the output terminal OUTPUT be at a low level, the shift register at the current stage outputs a low level; and when the second clock signal terminal CLKB provides a low level signal, all the eighth transistor M8, the fifth transistor M5, the tenth transistor M10 are turned off, the signal of the fixed voltage terminal VSS cannot be introduced to the output terminal OUTPUT and the pull-up node PU, the storage capacitor C starts to discharge, but since the clock signal has a short cycle, the time for discharging is very short, before the second clock signal terminal CLKB becomes to be at the high level next time, the output terminal OUTPUT still can retain the low level, the shift register at the current stage outputs a low level signal.

Thus, it can be seen that, the shift register can retain a low level output regardless of statuses of the two clock signals, as long as the input terminal INPUT and the reset terminal RESET are at a low level.

As described above, when the gate driving circuit of the present embodiment performs the forward scanning (situation S1), the shift registers sequentially output a turn-on signal (high level signal) in an order of "(n−1)$^{th}$ stage-n$^{th}$ stage-(n+1)$^{th}$ stage" (i.e., from top to bottom), there is a difference of half a clock cycle between operation statuses of adjacent shift registers. For the shift register at any stage (n$^{th}$ stage), the signal required by the input terminal INPUT thereof is ahead of the level of the pull-up node PU by half a clock cycle, thus the pull-up node PU of the shift register at the previous stage ((n−1)$^{th}$ stage) is capable of being connected to the input terminal INPUT of the shift register at the current stage, and simultaneously, for the shift register at any stage (n$^{th}$ stage), the signal required by the reset terminal RESET thereof is behind the level of the pull-up node PU by half a clock cycle, thus the pull-up node PU of the shift register at the next stage ((n+1)$^{th}$ stage) is capable of being connected to the reset terminal RESET of the shift register at the current stage; in this way, the shift registers at every stage sequentially experience a same driving procedure, the forward scanning is performed by the gate driving circuit (i.e., the gate driving circuit of the present embodiment) comprising the shift registers.

Figure 4:
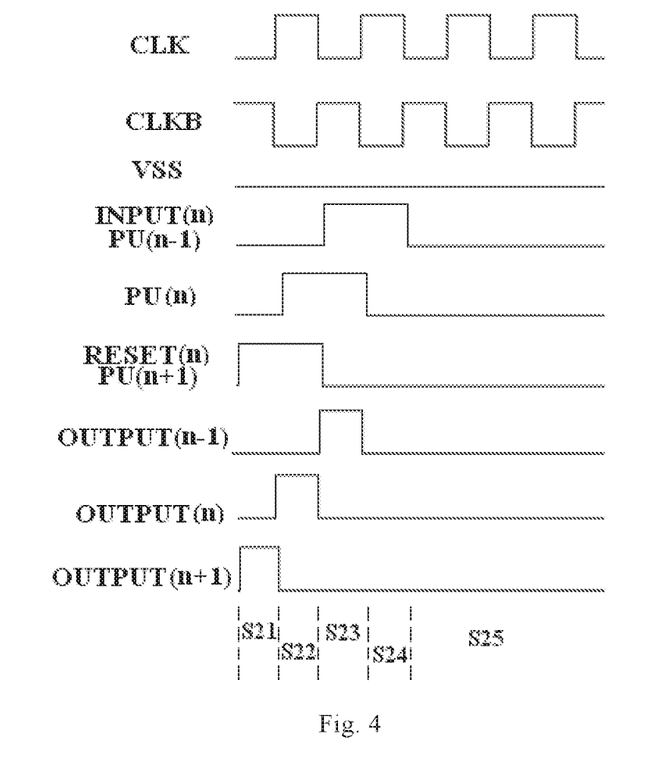
FIG. 4 shows a timing diagram of signals of the shift registers when the gate driving circuit in an embodiment of the present invention performs a backward scanning.

Situation S2: when the gate driving circuit of the present embodiment performs a backward (from bottom to top) scanning, as shown in FIG. 4, a procedure of operations of the shift registers in the gate driving circuit specifically comprises following periods of S21 to S25.

During a period of S21, a low level signal is provided to the first clock signal terminal CLK, a high level signal is provided to the second clock signal terminal CLKB, another low level signal is provided to the input terminal INPUT, another high level signal is provided to the reset terminal RESET, and further another low level signal is provided to the fixed voltage terminal VSS.

Similar that while performing the forward scanning, this period has no effect on the shift register at the current stage ($n^{th}$ stage), but is real. Correspondingly, for the shift register at the last stage, a separate signal may be input into the reset terminal RESET thereof, thus there is no this period therefor, the following period of S22 is directly started.

During the backward scanning, the shift register at the next stage ($(n+1)^{th}$ stage) operates prior to the shift register at the current stage, thus a high level signal will be provided to the reset terminal RESET of the shift register at the current stage when the pull-up node PU of the shift register at the next stage becomes to be at a high level. Thus, in the shift register at the current stage, the second transistor M2 is turned on so that the low level signal of the first clock signal terminal CLK is introduced to the pull-up node PU, and simultaneously the second clock signal terminal CLKB is at a high level, the tenth transistor M10 is turned on, the low level of the fixed voltage terminal VSS is introduced to the output terminal OUTPU through the tenth transistor M10, the shift register at the current stage outputs a low level signal.

During a period of S22, a high level signal is provided to the first clock signal terminal CLK, a low level signal is provided to the second clock signal terminal CLKB, another low level signal is provided to the input terminal INPUT, another high level signal is provided to the reset terminal RESET, and further another low level signal is provided to the fixed voltage terminal VSS.

During this period, the reset terminal RESET of the shift register at the current stage is still at the high level, the first clock signal terminal CLK becomes to be at the high level, thus the pull-up node PU also becomes to be at the high level, that is, both the reset terminal RESET of the shift register at the previous stage ($(n-1)^{th}$ stage) and the input terminal INPUT of the shift register at the next stage ($(n+1)^{th}$ stage) become to be at the high level, the shift register at the previous stage enters the period of S21 described above, and the shift register at the next stage enters the following period of S23. Since the pull-up node PU is at the high level, the ninth transistor M9 is turned on so that the high level of the first clock signal terminal CLK is introduced to the output terminal OUTPUT. Simultaneously, in the shift register at the current stage, the second clock signal terminal CLKB is at the low level, thus the tenth transistor M10 is turned off, the low level of the fixed voltage terminal VSS cannot enter the output terminal OUTPUT, the shift register at the current stage outputs a high level signal.

During a period of S23, a low level signal is provided to the first clock signal terminal CLK, a high level signal is provided to the second clock signal terminal CLKB, another high level signal is provided to the input terminal INPUT, another low level signal is provided to the reset terminal RESET, and further another low level signal is provided to the fixed voltage terminal VSS.

During this period, the shift register at the next stage ($(n+1)^{th}$ stage) enters the following period of S24, the pull-up node PU becomes to be at the low level, that is, the reset terminal RESET of the shift register at the current stage ($n^{th}$ stage) becomes to be at the low level; and simultaneously the shift register at the previous stage ($(n-1)^{th}$ stage) enters the period of S22, thus the input terminal INPUT of the shift register at the current stage ($n^{th}$ stage) becomes to be at the high level. In the shift register at the current stage ($n^{th}$ stage), the input terminal INPUT is at the high level, thus the first transistor M1 is turned on so that the high level signal of the second clock signal terminal CLKB is introduced to the pull-up node PU, the pull-up node PU retains the high level, thereby the ninth transistor M9 is turned on, the low level of the first clock signal terminal CLK is introduced to the output terminal OUTPUT, and the shift register at the current stage outputs a low level signal.

During a period of S24, a high level signal is provided to the first clock signal terminal CLK, another low level signal is provided to the second clock signal terminal CLKB, a high level signal is provided to the input terminal INPUT, further another low level signal is provided to the reset terminal RESET, and still another low level signal is provided to the fixed voltage terminal VSS.

During this period, the input terminal INPUT of the shift register at the current stage is still at the high level so that the low level of the second clock signal terminal CLKB is transferred to the pull-up node PU through the first transistor M1, the pull-up node PU becomes to be at a low level, the ninth transistor M9 is turned off, the signal of the first clock signal terminal CLK cannot be introduced to the output terminal OUTPUT, the output terminal OUTPUT retains the low level by the storage capacitor C, the shift register at the current stage outputs a low level signal.

During a period of S25, a low level signal is provided to the input terminal INPUT, another low level signal is provided to the reset terminal RESET, and further another low level signal is provided to the fixed voltage terminal VSS.

This period is the same as the period of S15 while performing the forward scanning, and during this period, both the input terminal INPUT and the reset terminal RESET of the shift register at the current stage are at the low level, thus the output terminal OUTPUT retains the low level by the storage capacitor C regardless of the signals of the two clock signal terminals, which will not be described in detail herein.

As described above, when the gate driving circuit of the present embodiment performs the backward scanning (situation S2), the shift registers sequentially output a turn-on signal (high level signal) in an order of "$(n+1)^{th}$ stage-$n^{th}$ stage-$(n-1)^{th}$ stage" (i.e., from bottom to top), there is a difference of half a clock cycle between operation statuses of adjacent shift registers. For the shift register at any stage ($n^{th}$ stage), the signal required by the input terminal INPUT thereof is behind the level of the pull-up node PU by half a clock cycle, thus the pull-up node PU of the shift register at the previous stage ($(n-1)^{th}$ stage) is capable of being connected to the input terminal INPUT of the shift register at the current stage, and simultaneously, for the shift register at any stage ($n^{th}$ stage), the signal required by the reset terminal RESET thereof is ahead of the level of the pull-up node PU by half a clock cycle, thus the pull-up node PU of the shift register at the next stage ($(n+1)^{th}$ stage) is capable of being connected to the reset terminal RESET of the shift register at the current stage; in this way, the shift registers sequentially experience a same driving procedure, the backward scanning is performed by the gate driving circuit (i.e., the gate driving circuit of the present embodiment) comprising the shift registers.

It can be seen that, in the gate driving circuit of the present embodiment, the forward scanning and the backward scanning (i.e., the dual scanning) may be achieved respectively as long as the initial signals are changed.

It should be understood that, although the above descriptions are given by taking all the transistors being N type transistors as an example, all the transistors also may be P type transistors, in this case, the levels of the signals should be inverted so that the gate driving circuit operates and outputs in accordance with the same procedure as above, except a difference that the low level output signal is the turn-on signal, which will not be described in detail herein.

Second Embodiment

The present embodiment provides an array substrate, comprising:
 a plurality of gate lines;
 the gate driving circuit described above, the output terminal of each of the shift registers of the gate driving circuit is connected to one of the gate lines.

Certainly, the array substrate also comprises other known structures such as data lines, a pixel circuit, which will not be described in detail herein.

The present embodiment further provides a display device comprising the array substrate described above.

Specifically, the display device may be any product or member with a display function, such as a liquid crystal display panel, an electronic paper, an OLED panel, a phone, a tablet computer, a television, a display, a notebook computer, a digital photo frame, a navigator.

It should be understood that, the above embodiments are merely exemplary embodiments for explaining principle of the present invention, but the present invention is not limited thereto. Various modifications and improvements may be made by those ordinary skilled in the art within the spirit and essence of the present invention, these modifications and improvements fall into the protection scope of the present invention.

The invention claimed is:

1. A shift register, comprising a buffer discharging device, a holding device, an output device, a pull-down device, a charging device, an input terminal, a reset terminal, a first clock signal terminal, a second clock signal terminal, a fixed voltage terminal and an output terminal, wherein:
 the buffer discharging device is configured to control whether to transfer a signal of the fixed voltage terminal to the output terminal and whether to transfer the signal of the fixed voltage terminal and a signal of the second clock signal terminal to a pull-up node in accordance with a signal of the input terminal, a signal of the reset terminal and a level of a pull-down node;
 the holding device is configured to control the level of the pull-down node in accordance with the signal of the second clock signal terminal and a level of the pull-up node;
 the output device is configured to control whether to transfer a signal of the first clock signal terminal to the output terminal in accordance with the level of the pull-up node;
 the pull-down device is configured to control whether to transfer the signal of the fixed voltage terminal to the output terminal in accordance with the signal of the second clock signal terminal;
 the charging device is configured to retain a level of the output terminal.

2. The shift register of claim 1, wherein the buffer discharging device comprises a first transistor, a second transistor, a third transistor and a fourth transistor, wherein:
 a first electrode of the first transistor is connected to the second clock signal terminal, a second electrode of the first transistor is connected to the pull-up node, and a gate of the first transistor is connected to the input terminal;
 a first electrode of the second transistor is connected to the pull-up node, a second electrode of the second transistor is connected to the first clock signal terminal, and a gate of the second transistor is connected to the reset terminal;
 a first electrode of the third transistor is connected to the pull-up node, a second electrode of the third transistor is connected to the fixed voltage terminal, and a gate of the third transistor is connected to the pull-down node;
 a first electrode of the fourth transistor is connected to the output terminal, a second electrode of the fourth transistor is connected to the fixed voltage terminal, and a gate of the fourth transistor is connected to the pull-down node.

3. The shift register of claim 2, wherein the holding device comprises a fifth transistor, a sixth transistor, a seventh transistor, an eighth transistor, wherein:
 a first electrode of the fifth transistor is connected to the second clock signal terminal, a second electrode of the fifth transistor is connected to the pull-down node, and a gate of the fifth transistor is connected to a first electrode of the seventh transistor and a second electrode of the eighth transistor;
 a first electrode of the sixth transistor is connected to the pull-down node, a second electrode of the sixth transistor is connected to the fixed voltage terminal, and a gate of the sixth transistor is connected to the pull-up node;
 the first electrode of the seventh transistor is connected to the gate of the fifth transistor, a second electrode of the seventh transistor is connected to the fixed voltage terminal, and a gate of the seventh transistor is connected to the pull-up node;
 a first electrode of the eighth transistor is connected to the second clock signal terminal, the second electrode of the eighth transistor is connected to the gate of the fifth transistor, and a gate of the eighth transistor is connected to the second clock signal terminal.

4. The shift register of claim 3, wherein the output device comprises a ninth transistor, wherein:
 a first electrode of the ninth transistor is connected to the first clock signal terminal, a second electrode of the ninth transistor is connected to the output terminal, and a gate of the ninth transistor is connected to the pull-up node.

5. The shift register of claim 4, wherein the pull-down device comprises a tenth transistor, wherein:
 a first electrode of the tenth transistor is connected to the output terminal, a second electrode of the tenth transistor is connected to the fixed voltage terminal, and a gate of the tenth transistor is connected to the second clock signal terminal.

6. The shift register of claim 5, wherein the charging device comprises a storage capacitor, wherein:
a first terminal of the storage capacitor is connected to the pull-up node, a second terminal of the storage capacitor is connected to the output terminal.

7. The shift register of claim 6, wherein,
all the transistors are N type transistors; or
all the transistors are P type transistors.

8. A gate driving circuit, comprising:
a plurality of cascaded shift transistors, each of the shift transistors is the shift register of claim 1.

9. The gate driving circuit of claim 8, further comprises a first control line, a second control line, a fixed voltage line, wherein:
the first control line is connected to the first clock signal terminals of all the shift registers at odd stages and the second clock signal terminals of all the shift registers at even stages;
the second control line is connected to the first clock signal terminals of all the shift registers at even stages and the second clock signal terminals of all the shift registers at odd stages;
the fixed voltage line is connected to the fixed voltage terminal of each of the shift registers;
the pull-up node of each of the shift registers is connected to the reset terminal of the shift register at a previous stage and the input terminal of the shift register at a next stage.

10. The gate driving circuit of claim 9, wherein a separate signal is input into the input terminal of the shift register at a first stage, and another separate signal is input into the reset terminal of the shift register at a last stage.

11. The gate driving circuit of claim 9, wherein the buffer discharging device of the shift register comprises a first transistor, a second transistor, a third transistor and a fourth transistor, wherein:
a first electrode of the first transistor is connected to the second clock signal terminal, a second electrode of the first transistor is connected to the pull-up node, and a gate of the first transistor is connected to the input terminal;
a first electrode of the second transistor is connected to the pull-up node, a second electrode of the second transistor is connected to the first clock signal terminal, and a gate of the second transistor is connected to the reset terminal;
a first electrode of the third transistor is connected to the pull-up node, a second electrode of the third transistor is connected to the fixed voltage terminal, and a gate of the third transistor is connected to the pull-down node;
a first electrode of the fourth transistor is connected to the output terminal, a second electrode of the fourth transistor is connected to the fixed voltage terminal, and a gate of the fourth transistor is connected to the pull-down node.

12. The gate driving circuit of claim 11, wherein the holding device of the shift register comprises a fifth transistor, a sixth transistor, a seventh transistor, an eighth transistor, wherein:
a first electrode of the fifth transistor is connected to the second clock signal terminal, a second electrode of the fifth transistor is connected to the pull-down node, and a gate of the fifth transistor is connected to a first electrode of the seventh transistor and a second electrode of the eighth transistor;
a first electrode of the sixth transistor is connected to the pull-down node, a second electrode of the sixth transistor is connected to the fixed voltage terminal, and a gate of the sixth transistor is connected to the pull-up node;
the first electrode of the seventh transistor is connected to the gate of the fifth transistor, a second electrode of the seventh transistor is connected to the fixed voltage terminal, and a gate of the seventh transistor is connected to the pull-up node;
a first electrode of the eighth transistor is connected to the second clock signal terminal, the second electrode of the eighth transistor is connected to the gate of the fifth transistor, and a gate of the eighth transistor is connected to the second clock signal terminal.

13. The gate driving circuit of claim 12, wherein the output device of the shift register comprises a ninth transistor, wherein:
a first electrode of the ninth transistor is connected to the first clock signal terminal, a second electrode of the ninth transistor is connected to the output terminal, and a gate of the ninth transistor is connected to the pull-up node.

14. The gate driving circuit of claim 13, wherein the pull-down device of the shift register comprises a tenth transistor, wherein:
a first electrode of the tenth transistor is connected to the output terminal, a second electrode of the tenth transistor is connected to the fixed voltage terminal, and a gate of the tenth transistor is connected to the second clock signal terminal.

15. The gate driving circuit of claim 14, wherein the charging device of the shift register comprises a storage capacitor, wherein:
a first terminal of the storage capacitor is connected to the pull-up node, a second terminal of the storage capacitor is connected to the output terminal.

16. The gate driving circuit of claim 15, wherein,
all the transistors are N type transistors; or
all the transistors are P type transistors.

17. The gate driving circuit of claim 10, wherein the buffer discharging device of the shift register comprises a first transistor, a second transistor, a third transistor and a fourth transistor, wherein:
a first electrode of the first transistor is connected to the second clock signal terminal, a second electrode of the first transistor is connected to the pull-up node, and a gate of the first transistor is connected to the input terminal;
a first electrode of the second transistor is connected to the pull-up node, a second electrode of the second transistor is connected to the first clock signal terminal, and a gate of the second transistor is connected to the reset terminal;
a first electrode of the third transistor is connected to the pull-up node, a second electrode of the third transistor is connected to the fixed voltage terminal, and a gate of the third transistor is connected to the pull-down node;
a first electrode of the fourth transistor is connected to the output terminal, a second electrode of the fourth transistor is connected to the fixed voltage terminal, and a gate of the fourth transistor is connected to the pull-down node.

18. The gate driving circuit of claim 17, wherein the holding device of the shift register comprises a fifth transistor, a sixth transistor, a seventh transistor, an eighth transistor, wherein:
a first electrode of the fifth transistor is connected to the second clock signal terminal, a second electrode of the fifth transistor is connected to the pull-down node, and a gate of the fifth transistor is connected to a first electrode of the seventh transistor and a second electrode of the eighth transistor;

a first electrode of the sixth transistor is connected to the pull-down node, a second electrode of the sixth transistor is connected to the fixed voltage terminal, and a gate of the sixth transistor is connected to the pull-up node;

the first electrode of the seventh transistor is connected to the gate of the fifth transistor, a second electrode of the seventh transistor is connected to the fixed voltage terminal, and a gate of the seventh transistor is connected to the pull-up node;

a first electrode of the eighth transistor is connected to the second clock signal terminal, the second electrode of the eighth transistor is connected to the gate of the fifth transistor, and a gate of the eighth transistor is connected to the second clock signal terminal.

19. The gate driving circuit of claim 18, wherein the output device of the shift register comprises a ninth transistor, wherein:

a first electrode of the ninth transistor is connected to the first clock signal terminal, a second electrode of the ninth transistor is connected to the output terminal, and a gate of the ninth transistor is connected to the pull-up node.

20. An array substrate, comprising:

a plurality of gate lines;

the gate driving circuit of claim 8, the output terminal of each of the shift registers of the gate driving circuit is connected to one of the gate lines.

* * * * *